United States Patent
Depaoli et al.

(10) Patent No.: US 9,444,438 B2
(45) Date of Patent: Sep. 13, 2016

(54) FREQUENCY DOUBLER AND RELATED METHOD OF GENERATING AN OSCILLATING VOLTAGE

(71) Applicant: STMicroelectronics S.r.l., Agrate Brianza (IT)

(72) Inventors: Emanuele Depaoli, Pavia (IT); Giovanni Steffan, Caneva (IT); Massimo Pozzoni, Pavia (IT); Simone Erba, Pavia (IT); Enrico Monaco, Carpi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 125 days.

(21) Appl. No.: 14/298,559

(22) Filed: Jun. 6, 2014

(65) Prior Publication Data

US 2014/0361815 A1    Dec. 11, 2014

(30) Foreign Application Priority Data

Jun. 10, 2013    (IT) .............................. MI2013A0947

(51) Int. Cl.
*H03B 19/00* (2006.01)
*H03K 5/00* (2006.01)
*H03B 5/12* (2006.01)
*H03B 25/00* (2006.01)

(52) U.S. Cl.
CPC .......... *H03K 5/00006* (2013.01); *H03B 5/124* (2013.01); *H03B 5/1215* (2013.01); *H03B 5/1228* (2013.01); *H03B 25/00* (2013.01); *H03B 2200/0074* (2013.01)

(58) Field of Classification Search
USPC .......................................... 327/122
See application file for complete search history.

(56) References Cited

U.S. PATENT DOCUMENTS

| 6,864,728 B1 * | 3/2005 | Lu ........................ H03D 7/1441 327/113 |
| 7,659,784 B2 * | 2/2010 | Jang ....................... H03B 19/14 331/117 R |
| 2012/0062286 A1 | 3/2012 | Ginsburg et al. |

OTHER PUBLICATIONS

Bonfanti, A. et al., "A 15-GHz Broad-Band ÷2 Frequency Divider in 0.13-um CMOS for Quadrature Generation," IEEE Microwave and Wireless Components Letters 15(11):724-726, Nov. 2005.
Burapattanasiri, B., "Sinusoidal Frequency Doublers Circuit With Low Voltage ±1.5 Volt CMOS Inverter," (IJCSIS) International Journal of Computer Science and Information Security 6(3), 4 pgs., 2009.
Jang, S-L. et al., "A dual-resonance injection-locked frequency doubler in 0.18 um CMOS technology," Microwave and Optical Technology Letters 54(1):193-196, Jan. 2012.
Monaco, E., et al., "Injection-Locked CMOS Frequency Doublers for u-Wave and mm-Wave Applications," IEEE Journal of Solid-State Circuits 45(8):1565-1574, Aug. 2010.

(Continued)

*Primary Examiner* — Lincoln Donovan
*Assistant Examiner* — Patrick Chen
(74) *Attorney, Agent, or Firm* — Seed IP Law Group PLLC (57) ABSTRACT

A frequency doubling device suitable to generate an output terminal voltage oscillating at a differential frequency double the frequency of the input differential voltage, includes a first differential pair of P-type transistors and a second differential pair of N-type transistors controlled by the differential input voltage, as well as an LC oscillator including a LC resonant dipole through which the absorbed current is forced by two differential pairs of transistors.

21 Claims, 10 Drawing Sheets

(56) References Cited

OTHER PUBLICATIONS

Rofougaran, A. et al., "A 900MHz CMOS LC-Oscillator with Quadrature Outputs," ISSCC96 / Session 24 / Analog Techniques / Paper SP 24.6, IEEE International Solid-State Circuits Conference—Digest of Technical Papers, pp. 392-393, Feb. 10, 1996.

Verma, S. et al., "A Unified Model for Injection-Locked Frequency Dividers," IEEE Journal of Solid-State Circuits 38(6):1015-1027, Jun. 2003.

Grözing, M. et al., "CMOS Ring Oscillator with Quadrature Outputs and 100 MHz to 3.5 GHz Tuning Range," Proceedings of the 29$^{th}$ European Solid-State Circuits Conference, 2003 (ESSCIRC '03), Sep. 16-18, 2003, pp. 679-682.

Craninckx, J. et al., "A Harmonic Quadrature LO Generator Using a 90° Delay-Locked Loop," Proceedings of the 30$^{th}$ European Solid-State Circuits Conference (ESSCIRC 2004), Sep. 21-23, 2004, pp. 127-130.

* cited by examiner

FREQUENCY DOUBLER AND RELATED METHOD OF GENERATING AN OSCILLATING VOLTAGE

BACKGROUND

1. Technical Field

This disclosure relates to electronic devices for generating differential oscillating voltages and more particularly to a frequency doubler that doubles the frequency of an input differential oscillating voltage and a related method of generating an output differential oscillating voltage with a frequency double the frequency of an input differential oscillating voltage.

2. Description of the Related Art

A serial communication system includes a receiver (FIG. 1b) and a transmitter (FIG. 1a) in which data are sampled with a clock whose phase is properly determined.

In the transmitter (FIG. 1a), an input stream of data PARALLEL DATA, which may include multiple low-frequency streams, is serialized with a serializer SERIALIZER and transmitted by a driver DRIVER as a stream of serial data OUTPUT DATA into a communication channel. The phase of the serialization clock SER CLK or of any of its submultiples SUB CLK is aligned to that of the incoming data streams PARALLEL DATA and to their associated clock DATA CLK by a phase aligner PHASE ALIGNER that generates a control signal CTRL. A phase interpolator PHASE INTERPOLATOR generates, according to the control signal CTRL, the serialization clock SER CLK with appropriate frequency and phase by combining two clocks in quadrature I and Q.

In the receiver (FIG. 1b), a serial incoming data stream INPUT DATA is typically amplified by a variable gain amplifier VGA and equalized by an analog circuit EQUALIZER. A circuit DFE&SAMPLER performs a decision feedback equalization and samples the equalized data using a sampling clock CLKS provided by a phase interpolator PHASE INTERPOLATOR. The sampled data are transformed into a parallel stream of data PARALLEL DATA by a deserializer DESERIALIZER.

A clock signal DES CLK, extracted from the incoming data stream by the deserializer, is provided together with the parallel stream of data to a clock and data recovery circuit CDR that generates a control signal CTRL. As in the transmitter, the phase interpolator generates, according to the control signal CTRL, the sampling clock CLKS with the correct frequency and phase using the two clocks in quadrature I and Q.

Figure 2:
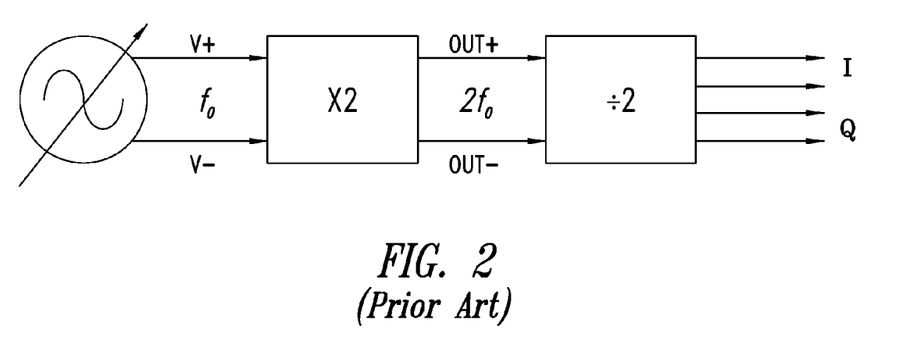
FIG. 2 depicts a generator of oscillating signals I and Q in quadrature comprising an oscillator that drives the cascade of a frequency doubler and a frequency divider.

There are various techniques for generating two clocks in quadrature, such as for example the so-called "frequency division" technique [1]. According to this technique, in-phase I and quadrature Q differential voltages are generated from an input differential oscillating voltage V+, V− at a frequency $f_0$ with the circuit of FIG. 2. This circuit uses a frequency doubler ×2, that generates a differential oscillating voltage OUT+, OUT− at a frequency $2f_0$ double than the input frequency $f_0$, and a frequency divider ÷2 that provides in output two differential oscillating voltages I and Q in quadrature between them.

Figure 3A:
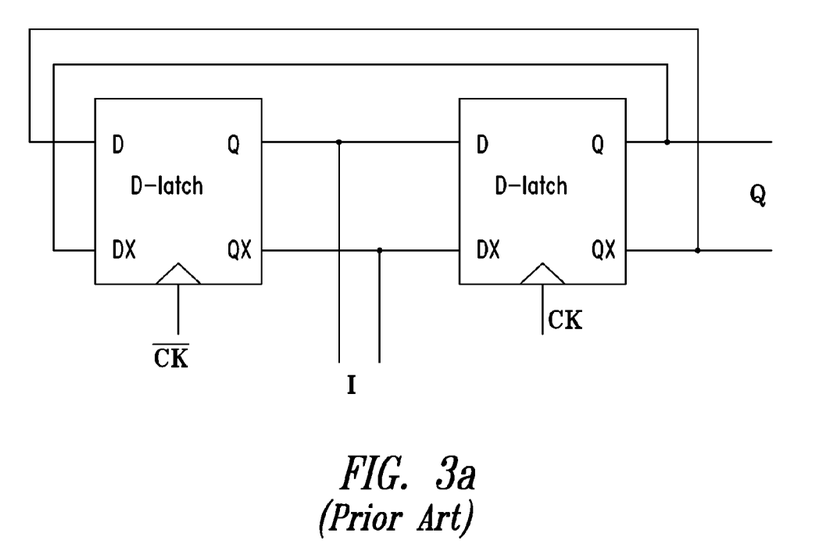
FIG. 3a depicts the core of a known double sampler based on D-type flip-flops.

The frequency divider ÷2 may be a double sampler of the type shown in FIG. 3a, which is substantially a loop composed of two D-latches connected in cascade, that generate the differential oscillating voltage in quadrature Q by sampling twice the differential oscillating voltage I using a clock CK and an inverted replica thereof $\overline{CK}$ at a frequency $2f_0$ double than the frequency $f_0$ of the oscillating signal I. The clock CK and the inverted replica thereof $\overline{CK}$ may be obtained with well-known circuits (not shown in the figure) from the differential oscillating voltage OUT+, OUT−.

Figure 3B:
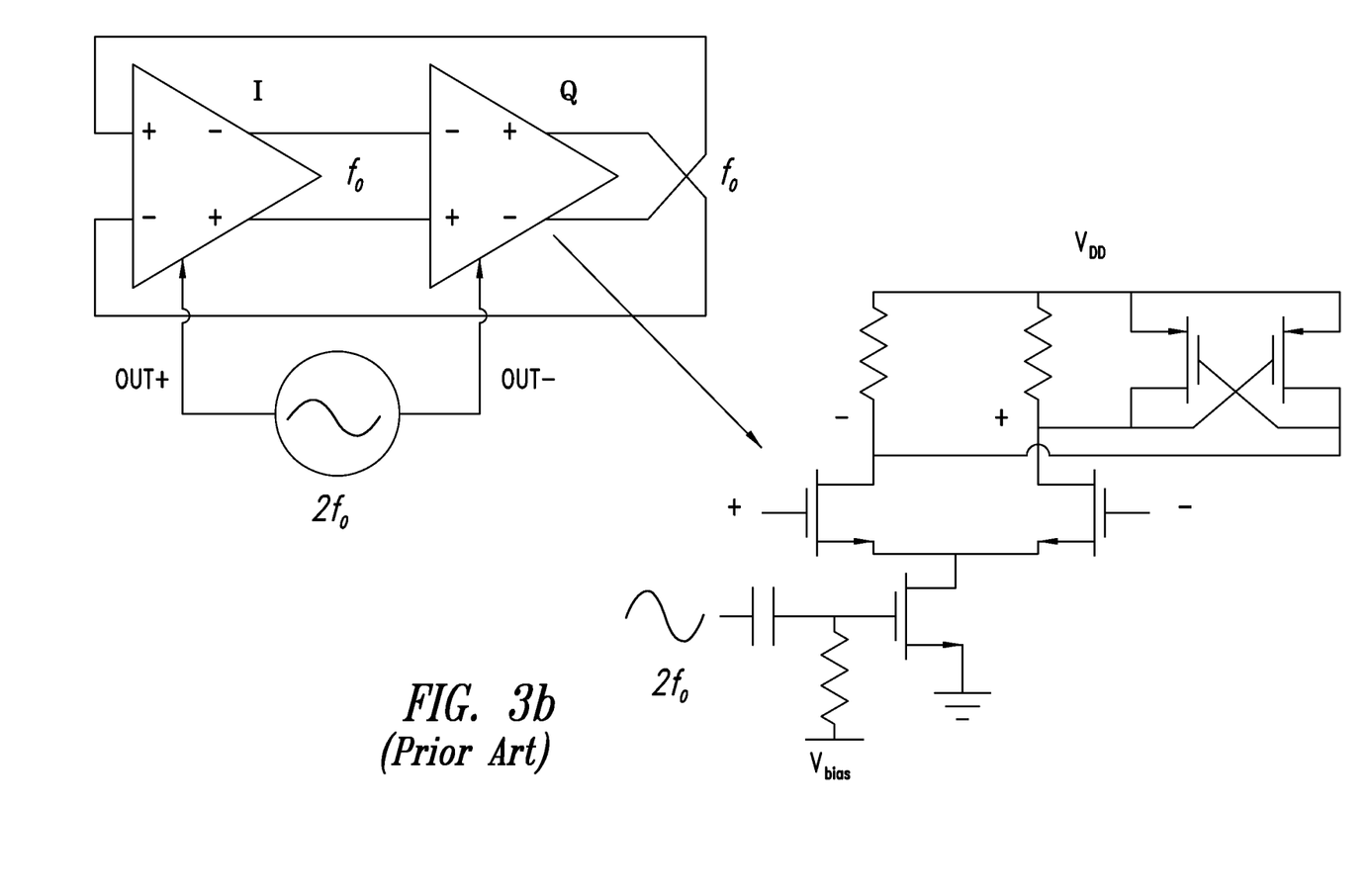
FIG. 3b depicts a known ring frequency divider, driven by a differential voltage controlled oscillator, and the transistor-level scheme of one stage of the divider.

The frequency divider ÷2 may be also a ring frequency divider of the type disclosed in [1] and depicted in FIG. 3b together with the transistor-level scheme of one stage. The shown frequency divider is a loop composed of two stages in series, each controlled in phase opposition in respect to the other using the differential outputs of a voltage controlled oscillator that functions at a frequency $2f_0$ double than the frequency $f_0$ of the oscillating signals I and Q.

The double sampler as well as the ring frequency divider employ a signal oscillating at twice the desired frequency $f_0$. This is inconvenient because the higher the frequency of the oscillating voltage to be generated in a stable and accurate manner, the more complicated the design of the voltage controlled oscillator. Moreover, phase noise of a voltage controlled oscillator may be limited, when the oscillation frequency varies over a broad range, only by increasing power consumption.

BRIEF SUMMARY

The applicants have found a method and a related frequency doubler adapted to generate on its output terminals an output differential oscillating voltage with a frequency double than the frequency of an input differential oscillating voltage, without being affected by the limitations of the above discussed prior devices.

In one embodiment, the frequency doubler has good performances in terms of phase accuracy and may operate in a wide band of frequencies because it comprises:

a first differential pair of P-type transistors configured to be controlled with the input differential oscillating voltage, having corresponding first current terminals referred to a positive supply line and corresponding second current terminals connected in common to a first output terminal of the frequency doubler;

a second differential pair of N-type transistors configured to be controlled with the input differential oscillating voltage, having corresponding first current terminals referred to a negative supply line and corresponding second current terminals connected in common to a second output terminal of the frequency doubler;

a LC oscillator comprising a resonant LC loop having at least an inductive component connected in parallel to at least a capacitive component, the terminals of the capacitive component of the loop being the first and second output terminals of the frequency doubler on which, in operation, is made available an output differential oscillating voltage at a frequency double than the frequency of the input differential oscillating voltage.

The herein disclosed frequency doubler may be used with a double sampler or a ring frequency divider for realizing a generator of differential oscillating signals in quadrature, on its turn usable in a serial communication system.

The claims as filed are integral part of this specification and are herein incorporated by reference.

BRIEF DESCRIPTION OF THE DRAWINGS

FIGS. 1a and 1b depict together a known serial communication system composed of a transmitter (1a) and a receiver (1b).

FIG. 10 is a generator of oscillating signals in quadrature including a frequency doubler according to the present disclosure and the double sampler of FIG. 3a.

DETAILED DESCRIPTION

In the ensuing description reference will be made to the case in which all transistors are made with a MOS technology, though the same observations hold also if the transistors are BJTs.

Figure 4:
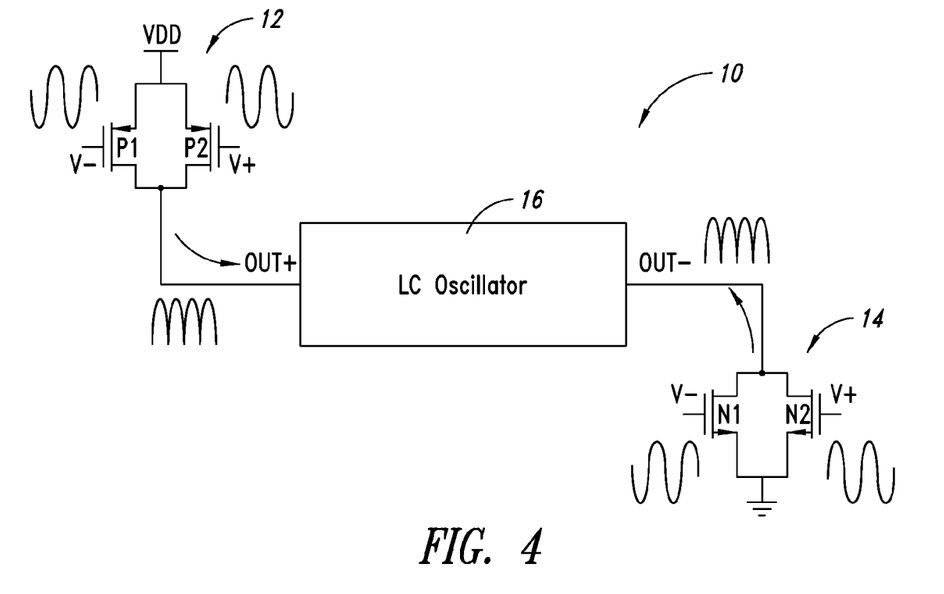
FIG. 4 is a frequency doubler according to the present disclosure.

A frequency doubler 10 according to one embodiment of the present disclosure is depicted in FIG. 4. It substantially comprises a first differential pair 12 of P-type transistors P1, P2 connected to an output terminal OUT+ of the frequency doubler, a second differential pair 14 of N-type transistors connected to another output terminal OUT− of the frequency doubler, and a LC oscillator 16 comprising a resonant LC loop including a capacitor having terminals that are the output terminals OUT+ and OUT− of the frequency doubler.

Figure 5:
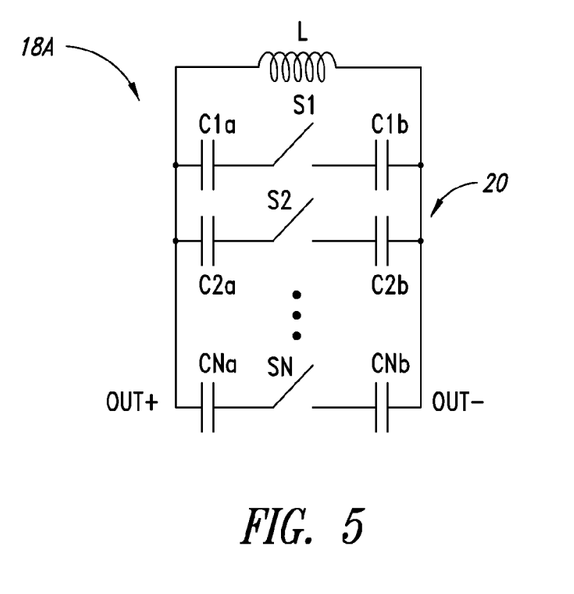
FIG. 5 is a resonant LC loop with adjustable capacitor of an ideal LC oscillator suitable for being used in the frequency doubler of FIG. 4.

According to an embodiment, the LC oscillator 16 may be simply composed of a resonant LC loop 18, for example with adjustable capacitance as shown in FIG. 5, composed of an inductor L and of capacitive component 20 coupled in parallel between the first and second output terminals OUT+, OUT−. The capacitive component 20 includes a plurality of capacitors C1a, C1b, C2a, C2b, . . . , CNa, CNb and switches S1, S2, . . . , SN that selectively connect respective pairs of the capacitors C1a, C1b, C2a, C2b, . . . , CNa, CNb in parallel with the inductor L.

Figure 6:
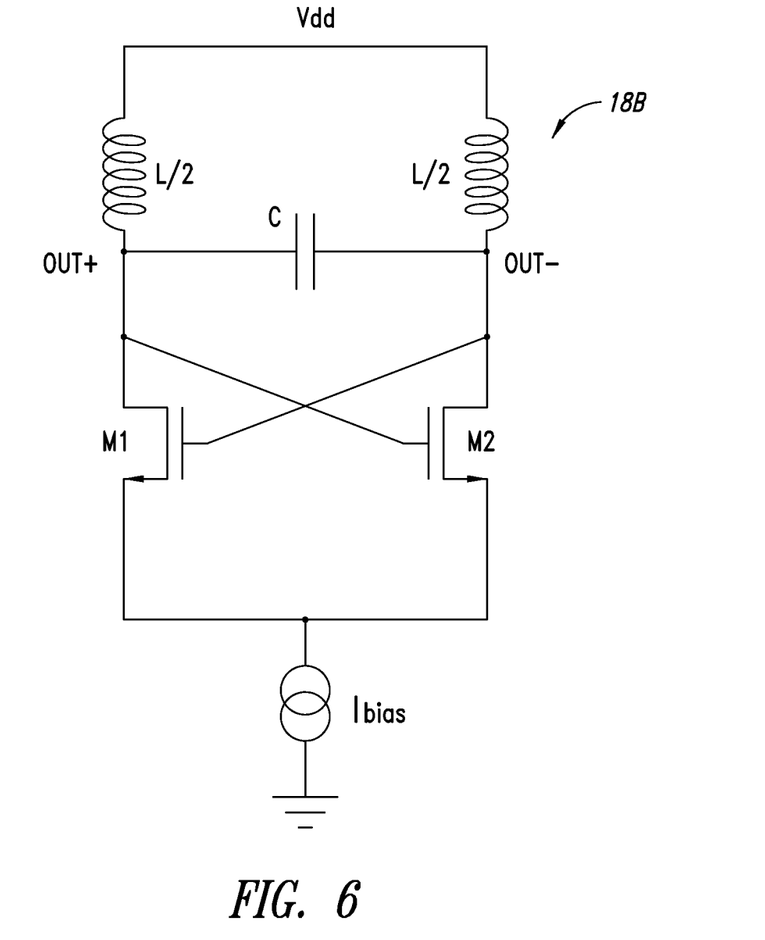
FIG. 6 is a N-type negative resistance oscillator comprising a resonant LC loop and a pair of cross-coupled transistors M1-M2 suited to be used in the frequency doubler of FIG. 4.

According to another embodiment, the LC oscillator may be a N-type negative resistance oscillator, as depicted in FIG. 6. This oscillator includes a resonant LC loop 18B that includes a capacitor C connected in parallel to a series connection of a pair of matched inductors L/2.

Ideally, the oscillation signal is generated through a lossless transfer of energy between the electric field of the capacitor C and the magnetic field of the inductors L/2, L2 and vice versa. In a real resonator, the amplitude of the oscillations is attenuated by losses, that may be modeled as a resistor (not shown) connected in parallel to the resonating LC loop 18B. The effect of the parasitic resistance may be compensated using a differential pair of cross-coupled transistors M1 and M2, that constitute an active circuit that behaves as a negative resistance circuit. The differential pair of transistors M1, M2 may be biased by a current generator Ibias, as shown in FIG. 6, or by any suitable bias network adapted to keep the transistors M1 and M2 in a conduction state. The transistors depicted in FIG. 6 are N-type MOSFETs, though an equivalent circuit to that of FIG. 6 may be easily realized using P-type MOSFETs or BJTs.

The transistors M1 and M2 have respective source terminals connected in common and coupled to ground through the low-side bias network Ibias and respective drain terminals respectively coupled to the first and second output terminals OUT+, OUT−. A gate terminal of the transistor M1 is shorted to the drain terminal of the transistor M2, and a gate terminal of the transistor M2 is shorted to the drain terminal of the transistor M1.

At the beginning of the oscillations, the resistance of the active circuit is greater than the parasitic resistance of the LC loop, thus noise is amplified. When a steady-state functioning condition is attained, the gain of the differential pair of cross-coupled transistors M1 and M2 is such to compensate the losses. This is equivalent to say that the value of the negative resistance of the active circuit formed by transistors M1, M2 compensates in steady-state conditions the parasitic resistance of the LC loop.

Figure 7:
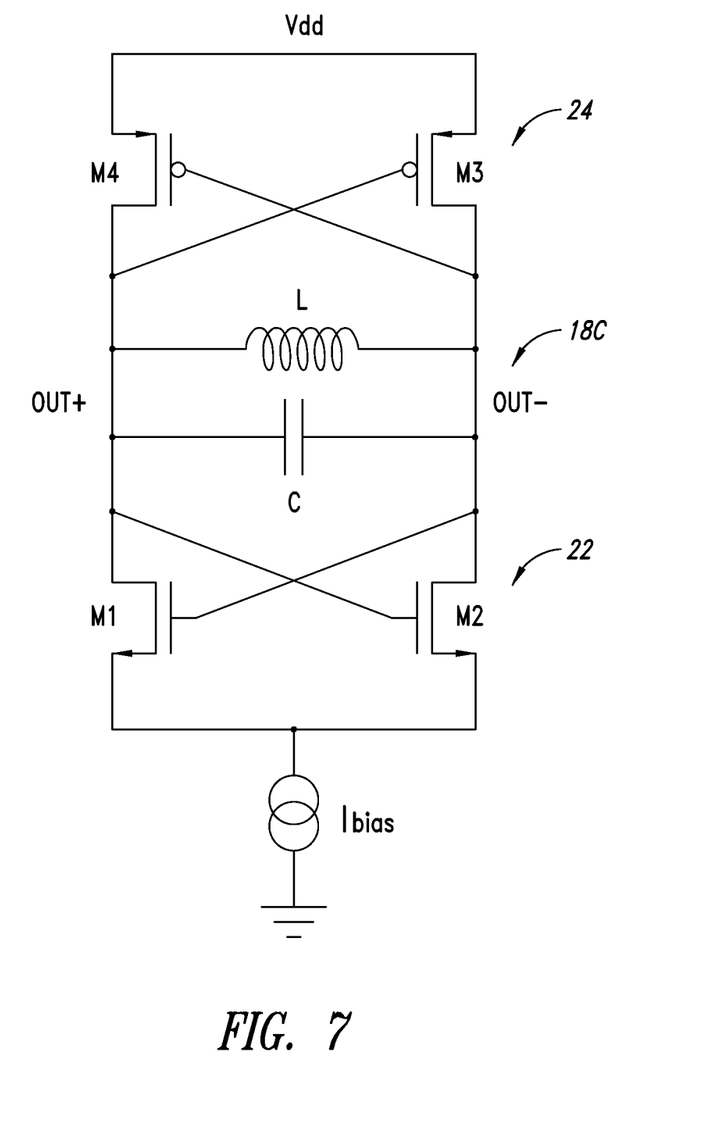
FIG. 7 is a NP-type negative resistance oscillator comprising a resonant LC loop and two complementary pairs of cross-coupled transistors M1-M2 and M3-M4 suited to be used in the frequency doubler of FIG. 4.

According to yet another embodiment, the LC oscillator is a PN-type negative resistance oscillator of the type shown in FIG. 7. The PN-type negative resistance oscillator includes a resonant LC loop 18C having an inductor L and a capacitor C electrically coupled in parallel to each other. In addition, the PN-type negative resistance oscillator includes and two complementary pairs of cross-coupled transistors M1-M2 and M3-M4 suited to be used in the frequency doubler of FIG. 4. In FIG. 7, the transistors M1-M2 of the first cross-coupled pair are NMOS transistors forming a first negative resistor active circuit and the transistors M3-M4 of the second cross-coupled pair are PMOS transistors forming a second negative resistor active circuit. The transistors M1 and M2 have respective source terminals connected in common and coupled to ground through the low-side bias network Ibias and respective drain terminals respectively coupled to the first and second output terminals OUT+, OUT−. A gate terminal of the transistor M1 is shorted to the drain terminal of the transistor M2, and a gate terminal of the transistor M2 is shorted to the drain terminal of the transistor M1. The transistors M3 and M4 have respective source terminals connected in common and coupled to a supply line Vdd and respective drain terminals respectively coupled to the second and first output terminals OUT−, OUT+. A gate terminal of the transistor M3 is shorted to the drain terminal of the transistor M4, and a gate terminal of the transistor M4 is shorted to the drain terminal of the transistor M3.

Each transistor pair shown in FIG. 4 is driven by a differential voltage V−, V+ oscillating at a frequency $f_0$ and generates a rectified current waveform, which is forced throughout the LC oscillator 16. In practice, each transistor pair P1, P2 and N1, N2 operates as a "push-push" pair that suppresses the main harmonic frequency and the odd multiples thereof. The resonating LC loop of the LC oscillator, preferably tuned at the second harmonic frequency $2f_0$ of the differential oscillating voltage V−, V+, filters out the DC component of the rectified current waveforms, thus the differential voltage on the output terminals OUT+, OUT−, i.e. on the terminals of the capacitive component of the resonant LC loop, oscillates at twice the frequency of the input differential voltage V−, V+.

This technique is advantageous because the jitter of the output oscillating signal OUT+, OUT− depends upon the jitter of the differential input voltage V−, V+ and not to the quality factor of the resonant LC loop. Therefore it is possible to obtain excellent performances in a broad range ("locking range") of frequencies even if the resonant LC loop of the LC oscillator is realized with low-cost adjustable capacitors and has a relatively poor quality factor.

In order to extend further the locking range, a plurality of capacitors may be connected or disconnected in parallel to the inductance L of the resonating LC loop, for example as in the LC loop 18A of FIG. 5, for adjusting the resonance frequency thereof over a broad frequency band.

The herein disclosed frequency doubler may be easily realized, because good performances may be obtained even with low cost components, and allows to generate a differential voltage that may oscillate with a frequency tunable in a wide locking range and with enhanced phase precision.

Figure 8:
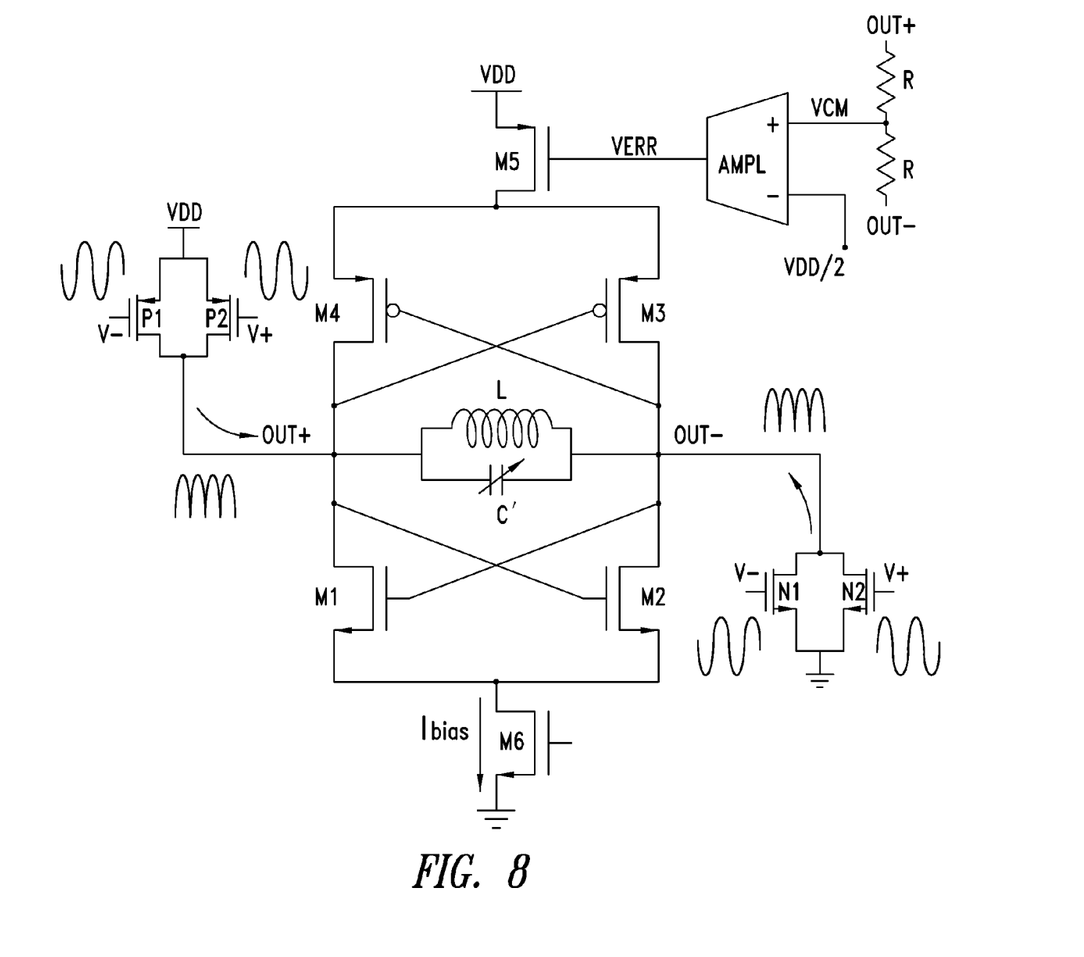
FIG. 8 is a frequency doubler according to the present disclosure.

An embodiment of a circuit scheme of a frequency doubler of this disclosure is depicted in FIG. 8. The depicted embodiment includes a NP-type negative resistance oscillator and a LC loop with an adjustable capacitor C', the LC oscillator being coupled to a positive supply line VDD and to a negative supply line (ground, in this case) through high-side and low-side bias networks, respectively. The LC oscillator includes the complementary pairs of cross-coupled transistors M1-M4 as shown in FIG. 7. The low-side bias network may be a current generator, implemented for example with a properly controlled N-type transistor M6, and the high-side bias network may be a P-type transistor M5 controlled with an error voltage VERR, generated by an amplifier AMPL, representative of the difference between the common mode voltage VCM on the output terminals OUT+, OUT− and a reference voltage. As shown in FIG. 8, the common mode voltage VCM may be made available for example on the center tap of a resistive divider composed of two matched resistors R and driven with a replica of the output differential oscillating voltage OUT+, OUT−. If the differential voltage OUT+, OUT− oscillates between the positive supply voltage VDD and ground, as in the depicted case, the reference voltage of the common mode voltage VCM may be equal to the half of the positive supply voltage.

More generally, the reference voltage may be a median value between the positive supply voltage and the negative supply voltage.

Figure 9:
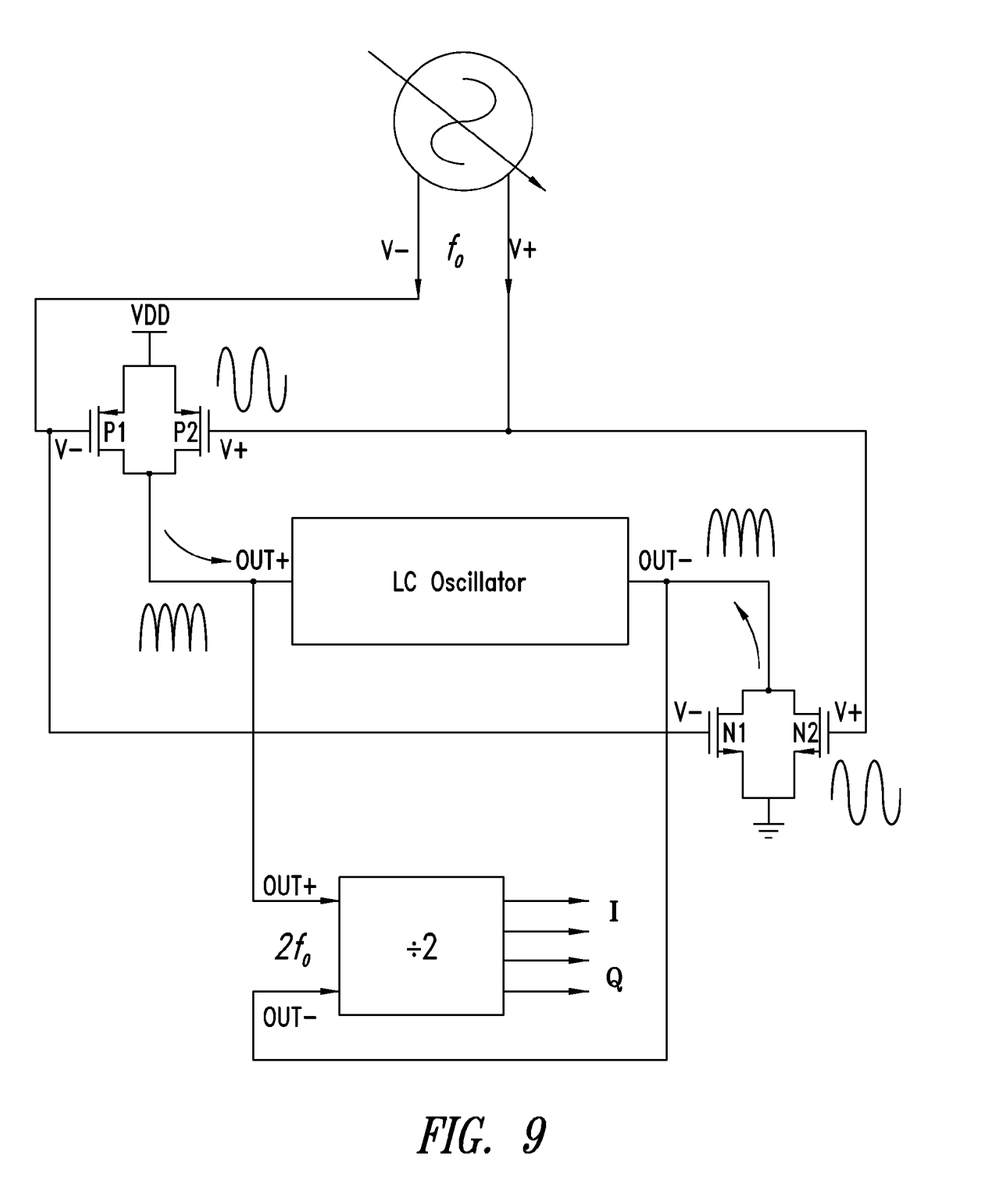
FIG. 9 is a generator of oscillating signals in quadrature including a frequency doubler according to the present disclosure.

A basic generator of oscillating signals I and Q in quadrature according to this disclosure is depicted in FIG. 9. It has the same circuit scheme of the generator of FIG. 2 but includes a frequency doubler of the type disclosed herein.

Figure 10:
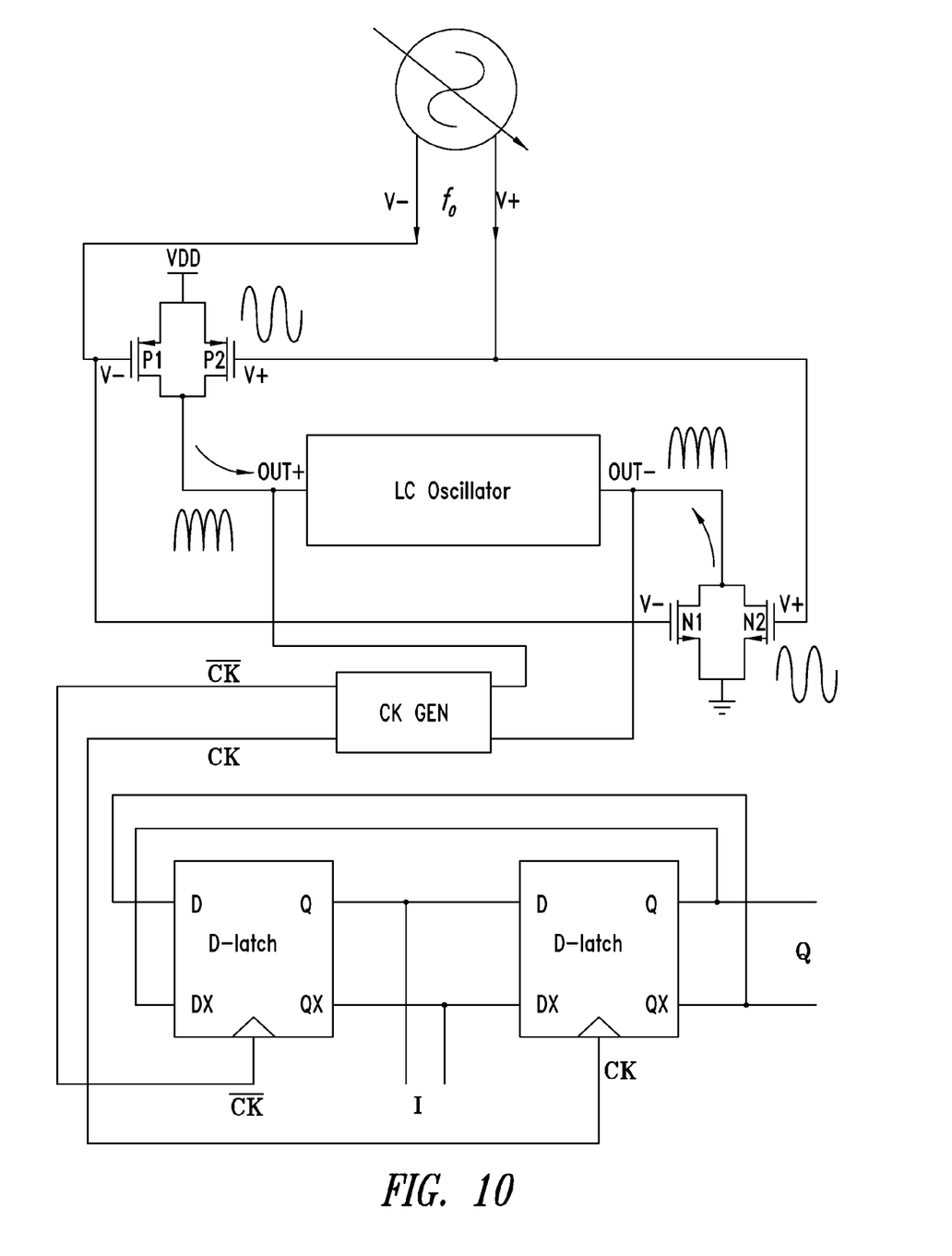

According to an embodiment, the frequency divider ÷2 may be a double sampler, as shown in the generator of FIG. 10, in which the clock CK and the inverted replica thereof $\overline{CK}$ are generated by a clock generator CK GEN from the differential oscillating voltage OUT+, OUT−.

Figure 11:
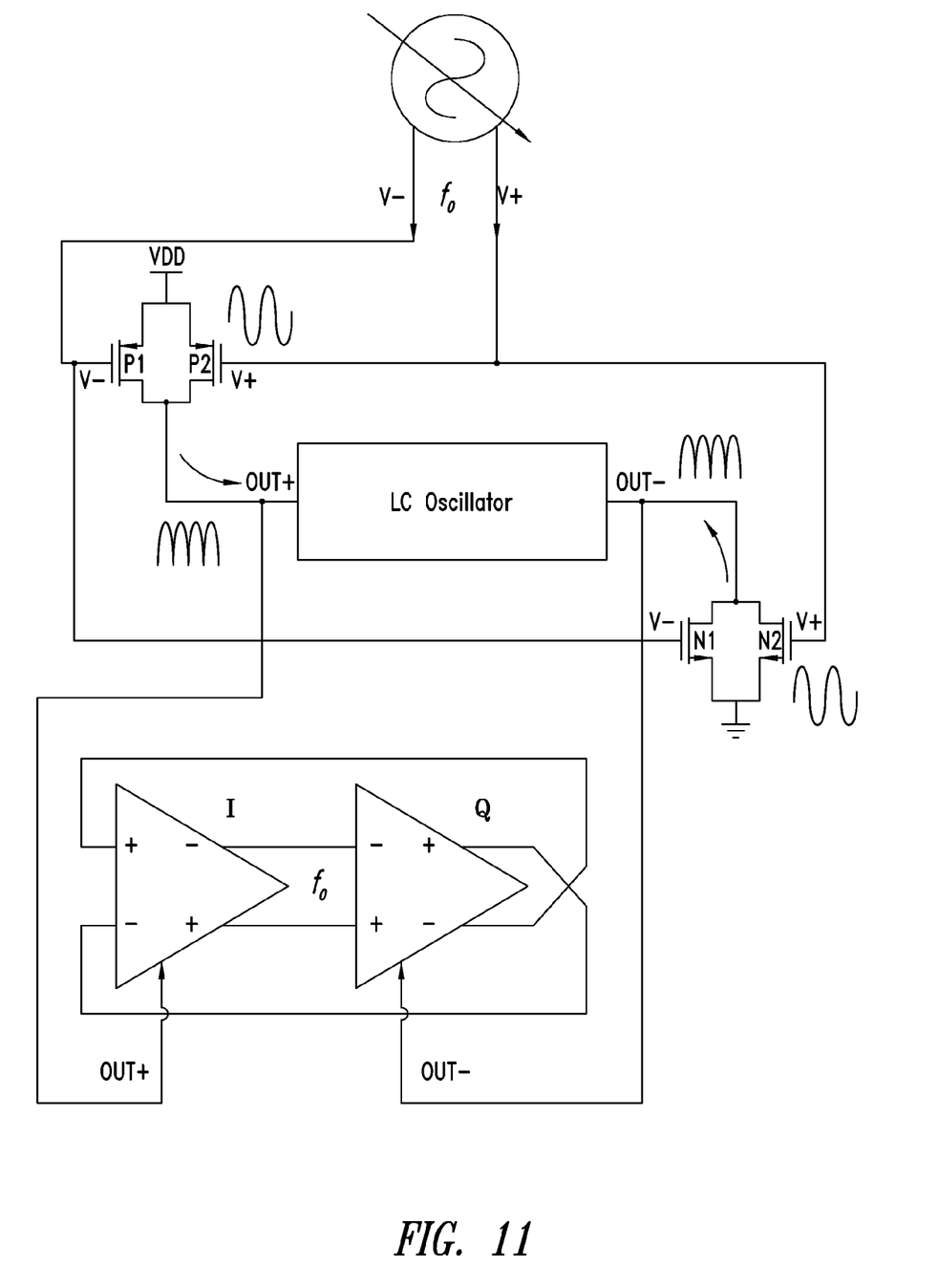
FIG. 11 is a generator of oscillating signals in quadrature including a frequency doubler according to the present disclosure and the ring oscillator of FIG. 3b.

According to another embodiment, the frequency divider ÷2 may be a ring oscillator, as shown in FIG. 11.

In the architectures of any of FIGS. 9 to 11 the LC oscillator may be any oscillator having a resonant LC loop, such as for example the LC oscillators depicted in FIGS. 5 to 8.

Figure 1A:
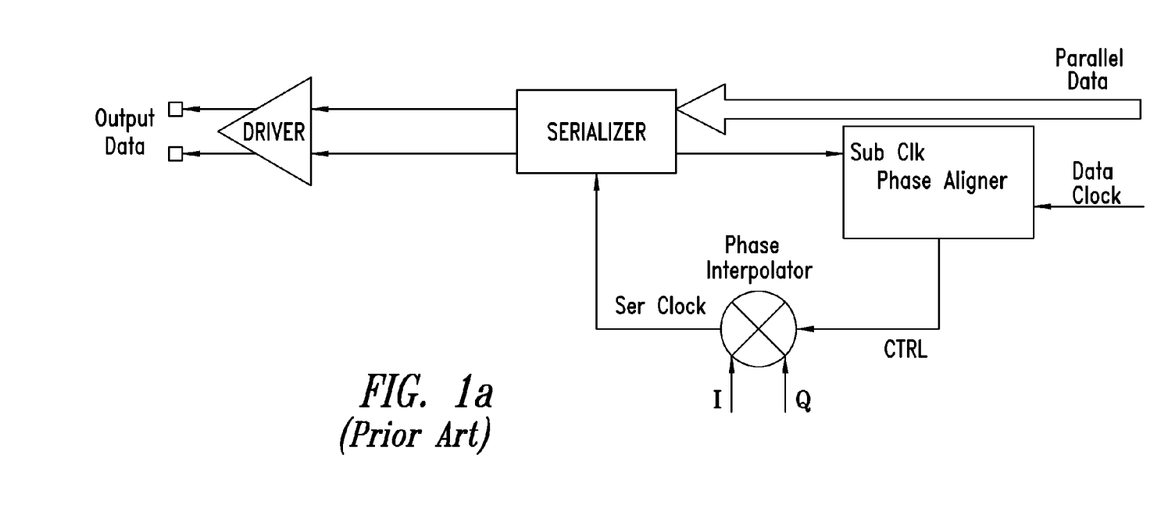
Figure 1B:
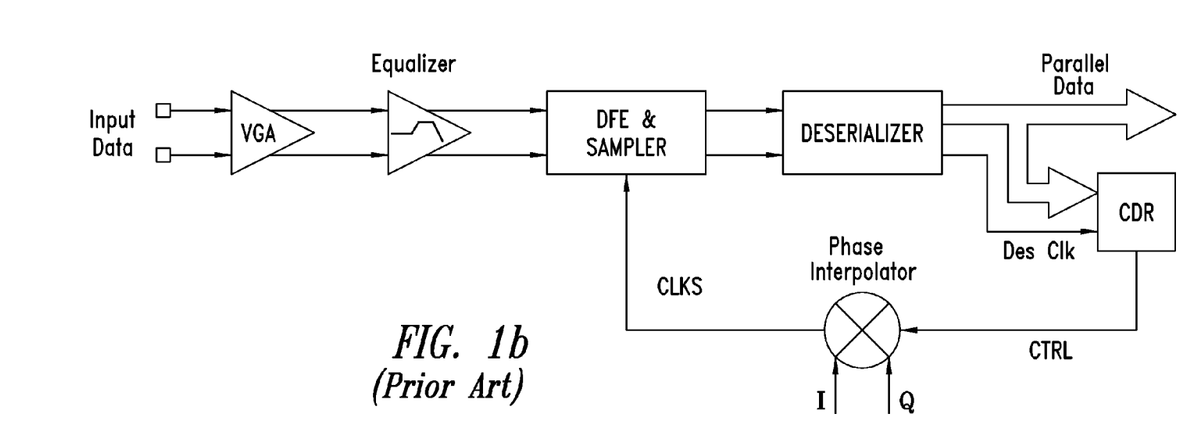

The disclosed generators may be used in a transmitter or a receiver of a serial communication system of the type shown in FIGS. 1a and 1b for generating the oscillating signals I and Q in quadrature.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

REFERENCES

[1] A. Bonfanti, A. Tedesco, C. Samori, and A. L. Lacaita, "A 15-GHz Broad-band/2 Frequency Divider in 0:13 m CMOS for Quadrature Generation," IEEE Microw. Wireless Compon. Lett., vol. 15, no. 11, pp. 724-726, November 2005.

The invention claimed is:

1. A frequency doubler for doubling a frequency of an input differential oscillating voltage, comprising:
   first and second output terminals;
   a differential first pair of first and second P-type transistors configured to be controlled with said input differential oscillating voltage, the P-type transistors having respective first current terminals coupled to a first supply line and corresponding second current terminals coupled in common to the first output terminal;
   a differential second pair of first and second N-type transistors configured to be controlled with said input differential oscillating voltage, the N-type transistors having respective first current terminals coupled to a second supply line and corresponding second current terminals coupled in common to the second output terminal;
   an LC oscillator including a resonant LC loop having an inductive component coupled in parallel to a capacitive component between the first and second output terminals, the differential first and second pairs and the LC oscillator being configured to produce at the first and second output terminals an output differential oscillating voltage at a frequency double the frequency of the input differential oscillating voltage, wherein said LC oscillator includes:
   a low-side bias network; and
   a first negative resistance active circuit including a third pair of third and fourth N-type transistors having respective first current terminals connected in common and coupled to said second supply line through the low-side bias network and respective second current terminals respectively coupled to the first and second output terminals, a control terminal of the third N-type transistor of said third pair being shorted to the second current terminal of the fourth N-type transistor of the third pair, and a control terminal of the fourth N-type transistor of said third pair being shorted to the second current terminal of the third N-type transistor of the third pair.

2. The frequency doubler of claim 1, wherein said inductive component includes a plurality of inductors, the capacitive component includes a capacitor having terminals coupled to the first supply line through the plurality of inductors.

3. The frequency doubler of claim 1, wherein said LC oscillator is a NP-type negative resistance oscillator comprising:

a second negative resistance active circuit that includes a fourth pair of third and fourth P-type transistors having respective first current terminals connected in common and coupled to said first supply line and respective second current terminals respectively coupled to the first and second output terminals of the frequency doubler, a control terminal of the third P-type transistor of said fourth pair being shorted to the second current terminal of the fourth P-type transistor of the fourth pair, and a control terminal of the fourth P-type transistor of said fourth pair being shorted to the second current terminal of the third P-type transistor of the fourth pair.

4. The frequency doubler of claim 3, wherein
the differential first and second pairs and the LC oscillator are configured to produce a common mode voltage on the first and second output terminal;
said low-side bias network is a bias current generator; and
said second negative resistance active circuit includes a high-side bias network that couples the first current terminals of the third and fourth transistors of the fourth pair to the first supply line, the high-side bias network including:
 a fifth P-type transistor; and
 an error amplifier configured to generate in operation a control voltage corresponding to a difference between the common mode voltage and a reference voltage, the error amplifier being configured to control the fifth P-type transistor.

5. The frequency doubler of claim 1, wherein the said capacitive component of the resonant LC loop has an adjustable capacitance.

6. A generator for generating differential oscillating signals in quadrature, comprising:
an oscillator configured to generate in operation a differential oscillating voltage;
a frequency doubler configured to produce an output differential oscillating voltage by doubling said differential oscillating voltage, the frequency doubler including:
 first and second output terminals;
 a differential first pair of first and second P-type transistors configured to be controlled with said input differential oscillating voltage, the P-type transistors having respective first current terminals coupled to a first supply line and corresponding second current terminals coupled in common to the first output terminal;
 a differential second pair of first and second N-type transistors configured to be controlled with said input differential oscillating voltage, the N-type transistors having respective first current terminals coupled to a second supply line and corresponding second current terminals coupled in common to the second output terminal; and
 an LC oscillator including a resonant LC loop having an inductive component coupled in parallel to a capacitive component between the first and second output terminals, the differential first and second pairs and the LC oscillator being configured to produce at the first and second output terminals the output differential oscillating voltage at a frequency double the frequency of the input differential oscillating voltage, wherein said LC oscillator includes:
  a low-side bias network; and
  a first negative resistance active circuit including a third pair of third and fourth N-type transistors having respective first current terminals connected in common and coupled to said second supply line through the low-side bias network and respective second current terminals respectively coupled to the first and second output terminals, a control terminal of the third N-type transistor of said third pair being shorted to the second current terminal of the fourth N-type transistor of the third pair, and a control terminal of the fourth N-type transistor of said third pair being shorted to the second current terminal of the third N-type transistor of the third pair; and
a frequency divider configured to produce the differential oscillating signals in quadrature from the output differential oscillating voltage.

7. The generator of claim 6, wherein the frequency divider is either a doubler sampler having a loop composed of two D-latches connected in cascade.

8. The generator of claim 6, wherein said inductive component includes a plurality of inductors, the capacitive component includes a capacitor having terminals coupled to the first supply line through the plurality of inductors.

9. The generator of claim 6, wherein said LC oscillator is a NP-type negative resistance oscillator comprising:
a second negative resistance active circuit that includes a fourth pair of third and fourth P-type transistors having respective first current terminals connected in common and coupled to said first supply line and respective second current terminals respectively coupled to the first and second output terminals of the frequency doubler, a control terminal of the third P-type transistor of said fourth pair being shorted to the second current terminal of the fourth P-type transistor of the fourth pair, and a control terminal of the fourth P-type transistor of said fourth pair being shorted to the second current terminal of the third P-type transistor of the fourth pair.

10. The generator of claim 9, wherein
the differential first and second pairs and the LC oscillator are configured to produce a common mode voltage on the first and second output terminal;
said low-side bias network is a bias current generator; and
said second negative resistance active circuit includes a high-side bias network that couples the first current terminals of the third and fourth transistors of the fourth pair to the first supply line, the high-side bias network including:
 a fifth P-type transistor; and
 an error amplifier configured to generate in operation a control voltage corresponding to a difference between the common mode voltage and a reference voltage, the error amplifier being configured to control the fifth P-type transistor.

11. A serial communication system comprising a transmitter or a receiver having a phase interpolator that includes a generator configured to generate oscillating signals in quadrature, the generator including:
an oscillator configured to generate in operation a differential oscillating voltage;
a frequency doubler configured to produce an output differential oscillating voltage by doubling said differential oscillating voltage, the frequency doubler including:
 first and second output terminals;
 a differential first pair of first and second P-type transistors configured to be controlled with said input differential oscillating voltage, the P-type transistors having respective first current terminals coupled to a first supply line and corresponding second current terminals coupled in common to the first output terminal;

a differential second pair of first and second N-type transistors configured to be controlled with said input differential oscillating voltage, the N-type transistors having respective first current terminals coupled to a second supply line and corresponding second current terminals coupled in common to the second output terminal; and an LC oscillator including a resonant LC loop having an inductive component coupled in parallel to a capacitive component between the first and second output terminals, the differential first and second pairs and the LC oscillator being configured to produce at the first and second output terminals the output differential oscillating voltage at a frequency double the frequency of the input differential oscillating voltage, wherein said LC oscillator includes:

a low-side bias network; and a first negative resistance active circuit including a third pair of third and fourth N-type transistors having respective first current terminals connected in common and coupled to said second supply line through the low-side bias network and respective second current terminals respectively coupled to the first and second output terminals, a control terminal of the third N-type transistor of said third pair being shorted to the second current terminal of the fourth N-type transistor of the third pair, and a control terminal of the fourth N-type transistor of said third pair being shorted to the second current terminal of the third N-type transistor of the third pair; and a frequency divider configured to produce the differential oscillating signals in quadrature from the output differential oscillating voltage.

12. The serial communication system of claim 11, wherein the frequency divider is either a doubler sampler having a loop composed of two D-latches connected in cascade.

13. The serial communication system of claim 11, wherein said inductive component includes a plurality of inductors, the capacitive component includes a capacitor having terminals coupled to the first supply line through the plurality of inductors.

14. The serial communication system of claim 11, wherein said LC oscillator is a NP-type negative resistance oscillator comprising:

a second negative resistance active circuit that includes a fourth pair of third and fourth P-type transistors having respective first current terminals connected in common and coupled to said first supply line and respective second current terminals respectively coupled to the first and second output terminals of the frequency doubler, a control terminal of the third P-type transistor of said fourth pair being shorted to the second current terminal of the fourth P-type transistor of the fourth pair, and a control terminal of the fourth P-type transistor of said fourth pair being shorted to the second current terminal of the third P-type transistor of the fourth pair.

15. The serial communication system of claim 14, wherein the differential first and second pairs and the LC oscillator are configured to produce a common mode voltage on the first and second output terminal;

said low-side bias network is a bias current generator; and said second negative resistance active circuit includes a high-side bias network that couples the first current terminals of the third and fourth transistors of the fourth pair to the first supply line, the high-side bias network including:

a fifth P-type transistor; and an error amplifier configured to generate in operation a control voltage corresponding to a difference between the common mode voltage and a reference voltage, the error amplifier being configured to control the fifth P-type transistor.

16. A method of generating an output differential oscillating voltage with a frequency double a frequency of an input differential oscillating voltage, comprising:

applying said input differential oscillating voltage to control nodes of first and second pairs of transistors of a frequency doubler that also includes:

first and second output terminals;

a differential first pair of first and second P-type transistors configured to be controlled with said input differential oscillating voltage, the P-type transistors having respective first current terminals coupled to a first supply line and corresponding second current terminals coupled in common to the first output terminal;

a differential second pair of first and second N-type transistors configured to be controlled with said input differential oscillating voltage, the N-type transistors having respective first current terminals coupled to a second supply line and corresponding second current terminals coupled in common to the second output terminal;

an LC oscillator including a resonant LC loop having an inductive component coupled in parallel to a capacitive component between the first and second output terminals, the differential first and second pairs and the LC oscillator being configured to produce at the first and second output terminals an output differential oscillating voltage at a frequency double the frequency of the input differential oscillating voltage, wherein said LC oscillator includes:

a low-side bias network; and a first negative resistance active circuit including a third pair of third and fourth N-type transistors having respective first current terminals connected in common and coupled to said second supply line through the low-side bias network and respective second current terminals respectively coupled to the first and second output terminals, a control terminal of the third N-type transistor of said third pair being shorted to the second current terminal of the fourth N-type transistor of the third pair, and a control terminal of the fourth N-type transistor of said third pair being shorted to the second current terminal of the third N-type transistor of the third pair; and generating said output differential oscillating voltage on the output terminals of the frequency doubler.

17. The method of claim 16, wherein the differential first and second pairs and the LC oscillator produce a common mode voltage on the first and second output terminal.

18. The method of claim 16, wherein said second negative resistance active circuit includes a high-side bias network that couples the first current terminals of the third and fourth transistors of the fourth pair to the first supply line, the high-side bias network including:
- a fifth P-type transistor;
- an error amplifier that generates in operation a control voltage corresponding to a difference between the common mode voltage and a reference voltage, the error amplifier being configured to control the fifth P-type transistor.

19. The method of claim 16, further comprising adjusting a resonance frequency of the LC loop by adjusting a capacitance of said capacitive component of the LC loop.

20. A frequency doubler for doubling a frequency of an input differential oscillating voltage, comprising:
- first and second output terminals;
- a differential first pair of first and second transistors positioned between the first supply line and the first output terminal and configured to be controlled with said input differential oscillating voltage, the first and second transistors having respective first current terminals coupled to a first supply line and corresponding second current terminals coupled in common to the first output terminal, the first pair being configured to conduct current from the first supply line to the first output terminal;
- a differential second pair of third and fourth transistors positioned between the second supply line and the second output terminal and configured to be controlled with said input differential oscillating voltage, the third and fourth transistors having respective first current terminals coupled to a second supply line and corresponding second current terminals coupled in common to the second output terminal, the second pair being configured to conduct current from the second output terminal to the second supply line; and
- an LC oscillator including a resonant LC loop having an inductive component coupled in parallel to a capacitive component between the first and second output terminals, the differential first and second pairs and the LC oscillator being configured to produce at the first and second output terminals an output differential oscillating voltage at a frequency double the frequency of the input differential oscillating voltage, wherein said LC oscillator includes:
- a low-side bias network coupled between the output terminals and the second supply line; and
- a first negative resistance active circuit including a third pair of fifth and sixth transistors having respective first current terminals connected in common and coupled to said second supply line through the low-side bias network and respective second current terminals respectively coupled to the first and second output terminals, a control terminal of the fifth transistor of said third pair being shorted to the second current terminal of the sixth transistor of the third pair, and a control terminal of the sixth transistor of said third pair being shorted to the second current terminal of the fifth transistor of the third pair, wherein said LC oscillator is a NP-type negative resistance oscillator comprising: a second negative resistance active circuit that includes a fourth pair of seventh and eighth transistors having respective first current terminals connected in common and coupled to said first supply line and respective second current terminals respectively coupled to the first and second output terminals of the frequency doubler, a control terminal of the seventh transistor of said fourth pair being shorted to the second current terminal of the eighth transistor of the fourth pair, and a control terminal of the eighth transistor of said fourth pair being shorted to the second current terminal of the seventh transistor of the fourth pair.

21. The frequency doubler of claim 20, wherein
the differential first and second pairs and the LC oscillator are configured to produce a common mode voltage on the first and second output terminal; and
said second negative resistance active circuit includes a high-side bias network that couples the first current terminals of the seventh and eighth transistors to the first supply line, the high-side bias network including:
- a ninth transistor; and
- an error amplifier configured to generate in operation a control voltage corresponding to a difference between the common mode voltage and a reference voltage, the error amplifier being configured to control the ninth transistor.

\* \* \* \* \*